United States Patent [19]

Pharney et al.

[11] Patent Number: 5,700,167
[45] Date of Patent: Dec. 23, 1997

[54] CONNECTOR CROSS-TALK COMPENSATION

[75] Inventors: Julian Robert Pharney; William Tracy Spitz, both of Indianapolis, Ind.

[73] Assignee: Lucent Technologies, Murray Hill, N.J.

[21] Appl. No.: 711,699

[22] Filed: Sep. 6, 1996

[51] Int. Cl.⁶ .................................................. H01R 23/02
[52] U.S. Cl. ........................................... 439/676; 439/941
[58] Field of Search ................................. 439/676, 941, 439/620

[56] References Cited

U.S. PATENT DOCUMENTS

| | | | |
|---|---|---|---|
| 5,186,647 | 2/1993 | Denkmann et al. | 439/395 |
| 5,299,956 | 4/1994 | Brownell et al. | 439/638 |
| 5,310,363 | 5/1994 | Brownell et al. | 439/676 |
| 5,326,284 | 7/1994 | Rohbot et al. | 439/676 |
| 5,362,254 | 11/1994 | Siemon et al. | 439/557 |
| 5,414,393 | 5/1995 | Rose et al. | 333/1 |
| 5,432,484 | 7/1995 | Klas et al. | 333/1 |

FOREIGN PATENT DOCUMENTS 2271678  4/1994  United Kingdom ........... H01R 13/00

*Primary Examiner*—Neil Abrams
*Assistant Examiner*—T. C. Patel

[57] ABSTRACT

A cross-talk compensating circuit member for use with communications systems connector arrays. The circuit member comprises a wiring board on which are printed conductive paths for each of the leads of the several (usually four) pairs in a connector jack, and the board may accommodate several such jacks. The conductive paths are routed in a manner to create facing inductive loop portions which are substantially mirror images of each other to produce inductive interaction among the different pair combinations. Capacitive coupling is also used in one embodiment.

16 Claims, 5 Drawing Sheets

| PAIR | JACK PIN | POLARITY |
|---|---|---|
| I | 5 | + |
| I | 4 | − |
| II | 1 | + |
| II | 2 | − |
| III | 3 | + |
| III | 6 | − |
| IV | 7 | + |
| IV | 8 | − |

FIG. 10

| PAIR | AS CLAIMED | LEAD | CONNECTOR MEMBER | CONDUCTIVE PATH |
|---|---|---|---|---|
| I | FIRST | 1<br>2 | 4<br>5 | 51<br>54 |
| II | THIRD | 1<br>2 | 2<br>1 | 43<br>48 |
| III | SECOND | 1<br>2 | 6<br>3 | 57<br>61 |
| IV | FOURTH | 1<br>2 | 8<br>7 | 66<br>64 |

FIG. 11

CONNECTOR CROSS-TALK COMPENSATION

FIELD OF INVENTION

This invention relates to reduction of cross-talk in telecommunications systems and, more particularly, to the reduction of cross-talk occurring in connectors and connector jacks used in such systems.

BACKGROUND OF THE INVENTION

Telecommunications and data transmission systems are more and more being called upon to operate at higher and higher frequencies with the huge increases in signaling traffic. Although present day cables and wiring can, theoretically, handle such increased frequencies, one of the problems encountered is an increase in cross-talk as frequency of transmission is increased. At frequencies above, for example, one megahertz (1 MHz), the degradation of signals due to cross-talk becomes unacceptable. One source of cross-talk is the electromagnetic radiation from the wire pairs in, for example, a transmission cable which induces unwanted signals, i.e., cross-talk, in adjacent pairs, thereby materially decreasing signal-to-noise ratios and resulting also in increased error rate in data transmission. Various arrangements have been used for reducing cross-talk in cables, such as shielding individual pairs, helically winding twisted pairs, or, where possible, increasing the physical separation of one pair from another.

Cross-talk also occurs in the station hardware and its connection to the cable or cables. The design of station hardware, and, more particularly the connectors therefor, must include provisions for reducing cross-talk within the connectors themselves or for counteracting or canceling the cross-talk which is an inevitable product of most such connectors. The plugs and jacks that are commonly used in telecommunications equipment generally include up to eight wires (four pairs) that are necessarily oriented both parallel and close together, a condition that leads to excessive cross-talk at high frequencies. Inasmuch as such plugs and jacks generally meet ANSI/EIA/TIA standards of wire and terminal connections, the connector wiring, in accordance with these standards, is such as to produce undesired cross-talk. In U.S. Pat. No. 5,186,647 of Denkmann, et al., there is shown an electrical connector arrangement specifically aimed at reducing such cross-talk. The connector of that patent comprises a number of input and output terminals interconnected by a pair of lead times mounted on a dielectric spring block. Each lead frame comprises a plurality of flat elongated conductors each terminated by a spring contact at one end and an insulation displacement connector at the other end. Three of the conductors of one lead frame overlap three conductors of the other frame within a designated crossover region, inducing compensating cross-talk among specific ones of the conductors occurring in use. While such a plug and jack arrangement functions well in reducing cross-talk, it requires a specific modification of existing hardware, and thus represents an added expense. As a consequence, other solutions to the cross-talk problem have been sought. For example, it has been found that the cross-talk coupling induced by the modular plug and jack interface can be reduced to a great extent by the judicious placement of conductors after they exit the modular jack so as to induce signals of opposite phase to those which were induced inside the plug and jack. Such a judicious placement of the conductors can be accomplished by having the conductors exit from the modular jack to a printed wiring board, in which case routing of the wires can be such as to produce a net reduction in cross-talk The circuit traces that form the pairs of conductors preferably are routed in a pattern that produces cross-talk opposite in polarity to the pattern that produces the cross-talk in the jack and plug.

There are, in the prior art, numerous printed circuit board arrangements for reducing the cross-talk. In U.S. Pat. No. 5,310,363 of Brownell et al., there is shown one such arrangement wherein the cross-talk occurring within the connector is reduced by, in effect, reversing the polarity of compensating cross-talk on a circuit board. Thus, where a first conductor of a first pair is adjacent to the first conductor of a second pair and cross talking therewith within one connector, the first conductor of the first pair is routed on a circuit board attached to the connector to be parallel and adjacent to the second conductor of the second pair over a predetermined distance to produce cross-talk of the opposite polarity, thereby effectively canceling the cross-talk which was generated within the connector. A similar such arrangement, using the same basic principles, is shown in U.S. Pat. No. 5,299,956 of Brownell, et al. When a circuit board of the type shown in the Brownell, et al. patents is used, and especially where conductor cross-overs, as shown in the Brownell, et al. U.S. Pat. No. 5,310,363, are involved, care must be exercised to provide sufficient insulation or isolation of the conductors from each other at the cross-over point. On the other hand, if both surfaces, i.e., top and bottom, of the board are used, the cross-over can easily be effected without any special treatment. In U.S. Pat. No. 5,414,393 of Rose, et al. there is shown one such printed circuit board arrangement wherein crossing conductors are on opposite surfaces of the board. The Rose, et al. arrangement is designed to reduce cross-talk induced across adjacent conductor terminals by having each of the conductors on the circuit board following zig-zag paths to simulate twisted pairs. Where there are four conductive paths, the first and third paths simulate a twisted pair as do the second and fourth paths, and the cross-talk induced thereby substantially cancels that induced by the connector. A somewhat similar arrangement is shown in U.S. Pat. No. 5,432,484 of Klas, et al. which, however, does not rely as heavily on cross-overs as the arrangement of the Rose, et al. patent, although it does have two cross-overs. As can be seen in Klas, et al. with particular reference to FIG. 1, there are basically only two cross-overs, leads 24 and 26 crossing each other twice. The Klas et al. arrangement includes four conductive paths between four input and four output terminals, the paths being formed on a printed wiring board. The first and third paths are in relatively dose proximity as are the second and fourth paths, which are spaced therefrom on the circuit board. Thus, there is induced, cross-talk between the first and third paths and induced cross-talk between the second and fourth paths, with the cross-talk thus induced tending to cancel the cross-talk induced at the several terminals of the connectors. For example, the cross-talk energy induced in the second path is canceled by the cross-talk energy in the fourth path when there is cross-talk between those two paths, and the cross-talk energy induced in the first path is canceled by the cross-talk energy induced in the third path when there is cross-talk between those two paths. The cross-talk between the paths is enhanced by placing path three closely adjacent path one and path four closely adjacent path two.

The aforementioned prior art arrangements all reduce cross-talk to some extent. However, they rely, in general, upon various forms of cross-overs and/or conductor path intertwining. A simple, and hence, more economical, form of cross-talk reduction that reliably accomplishes a large measure of cross-talk elimination is, therefore, a desirable aim.

SUMMARY OF THE INVENTION

The present invention is based upon the fact that large amounts of compensating cross-talk can be induced in the conductor paths on a circuit board by utilizing mirror image paths and facing inductive loops. It is possible to generate or induce compensating cross-talk on a circuit board by having mirror image paths on the top and bottom surfaces and facing inductive loops, depending upon the connections made thereto. In a first preferred embodiment of the invention, a circuit board has printed on one side (the top, for example) a pattern of paths for four pairs of conductors, in which, as a convention, one conductor of a pair is designated a tip, or positive going, and the other conductor is designated a ring, or negative going. Each tip and ring pair, per convention, constitutes a complete signal transmission line.

In accordance with a feature of the invention, four aligned first contact holes are designed to receive the pins from a connector bearing the negative or ring portions of the signals in the four pairs of conductors, and four separately aligned second contacts staggered relative to the first contacts are adapted to receive the pins from the connector bearing the positive or tip portions of the signals in the four pairs of conductors. The contact holes extend completely through the circuit board from top to bottom. In the array of contacts thus formed a pair of contacts, one first contact and one second contact, receive the two conductors of a tip and ring pair, the ring line being formed on the top surface of the board and the tip line being formed on the bottom surface of the board. The path of each of the ring lines extends either directly to an output contact, or, at an intermediate point, along its length to a pass-through opening to the bottom surface of the board and then to an output contact.

It is a feature of the present invention that the leads or lines of each pair, the pairs being designated pairs I,II,III, and IV, form, in conjunction with the leads or lines of another pair, a pair of facing inductive loops which act to induce compensating cross-talk between the pairs of leads. For interaction between the inductive loops, it has been found that the interaction therebetween is maximized when the loops are substantially mirror images of each other. The loops thus formed by the paths are not closed loops over the image area although the inductive effect is as if they were closed. As hereinafter used, "loop" refers to such a configuration. Thus, for pairs I and II, the tip and ring leads of pair I form an inductive loop on one surface of the board, and the tip and ring leads of pair II form a facing inductive loop on the opposite surface of the board, which is substantially a mirror image of the loop formed by the leads of pair I. Ideally, the tip lead of pair I is directly opposite the ring lead of pair II, and the tip lead of pair II is directly opposite the ring lead of pair I. For ease of understanding, there are four pairs of lines designated I,II,III, and IV, with each line of each pair being either a tip I$^+$, II$^+$, III$^+$, and IV$^+$, or a ring I$^-$, II$^-$, III$^-$, and IV$^-$.

In order to compensate for cross-talk between pairs I and III, the ring leads for both pairs are on one surface of the board and are, over a portion of their lengths, closely adjacent and preferably substantially mirror images of each other. Also, on the opposite surface of the board, the tip leads for both pairs are in close proximity and are mirror images of each other. Thus, there are formed two facing inductive loops, which are substantially mirror images of each other, each lying in a vertical plane relative to the surface of the board. Such an arrangement gives both inductive and capacitive coupling between pairs I and III, and also aids in impedance management. Compensation for cross-talk between pairs II and III is achieved by both the tip and ring leads of pair II being on one surface of the board and the tip and ring leads for pair III being on the opposite surface of the board, with the ring leads being substantially mirror images of each other over a portion of their lengths, and the tip leads being mirror images of each other over a similar portion of their length thereby producing two facing inductive loops which are substantially mirror images of each other.

It has been found that the leads of pair IV do not need to be cross-talk compensated by means of inductive coupling. In a second embodiment of the invention, these two leads are capacitively coupled with the leads for pairs I and III for cross-talk reduction when cross-talk compensation for pair IV is necessary.

In these embodiments of the present invention, a circuit board has all of the necessary paths thereon for connecring the connector to other circuitry, for compensaring for or eliminaring cross-talk among the several conductor pairs without resort to the cross-overs which typify much of the prior art, and which are placed on the board in a compact array of loops without materially altering the impedance of each pair of conductors.

The various features of the present invention and the principles involved will be more readily apparent from the following detailed description read in conjunction with the accompanying drawings.

DESCRIPTION OF THE DRAWINGS

FIG. 10 is a chart showing the pair connections and the polarities applied to the jack pins of the circuit board of the invention; and FIG. 11 is a table giving the relationships of the leads, connector members or pins, and conductive paths as set forth in the specification and drawings.

DETAILED DESCRIPTION

Figures 1, 2:
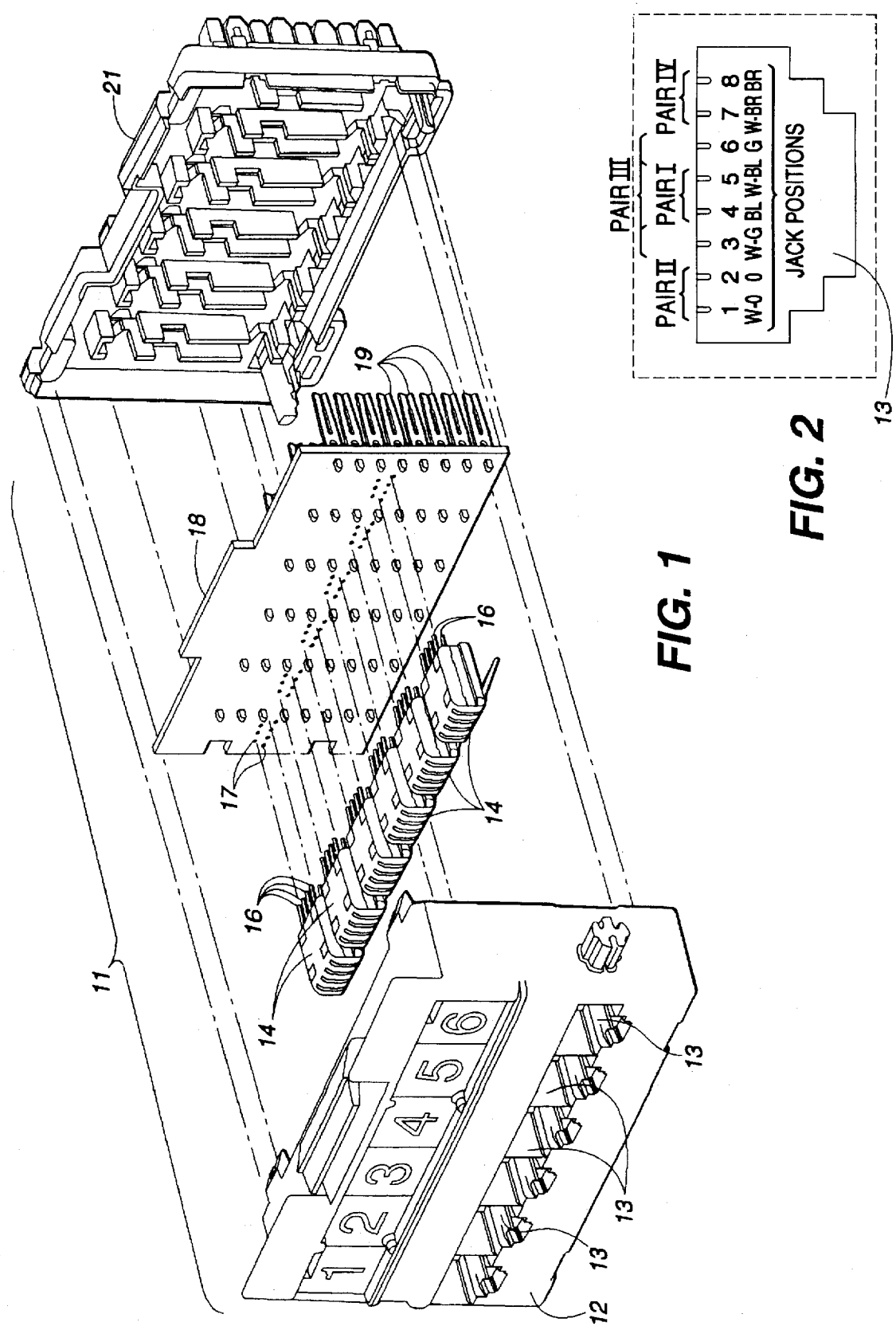
FIG. 1 is an exploded perspective view of a patch distribution module with which the circuit board of the invention is used.
FIG. 2 is a diagrammatic view of one of the jack frame openings of the module of FIG. 1, illustraring the standard conductor pair orientation.

In FIG. 1 there is shown a patch distribution module 11 which comprises a front housing 12 having a plurality of apertures 13 for receiving standard modular plugs, not shown. Apertures 13 extend through housing member 12 and are adapted to receive, at the rear thereof, a plurality of connector jacks 14 which, when in place, connect to the modular plugs. In FIG. 2 there is shown a diagram of the positioning of the wires for, in this illustrative embodiment, four pairs of wires designated, for convenience, pairs I, II, III, and IV. The standard convention for a four pair plug and jack connector having eight positions, is shown in FIG. 2, where one wire of pair II, for illustrative purposes the tip wire, occupies position 1 and the corresponding ring wire occupies position 2. The tip wire of pair I occupies position 5 and the corresponding ring wire occupies position 4. The tip wire of pair III occupies position 3 and the ring wire occupies position 6, thereby straddling pair I. The tip wire of pair IV occupies position 7 and the ring wire thereof occupies position 8. For the purposes of this discussion, the tip wire will be considered as positive going, or positive, and the ring wire will be considered as negative going, or negative. The wire placement convention shown in FIG. 2 obtains from the plug through the connector jacks 14 and it is in that portion of the arrangement shown in FIG. 1 where cross-talk is induced. The wiring shown in FIG. 2 is designated TIA/EIA 568A, type B. For TIA/EIA 568A & type A, wiring pairs II and III are interchanged. The remainder of this discussion is directed to Type B for simplicity, although Type A can readily be used. The connector jacks each have, in the four pair configuration, eight jack pins 16 protruding from the rear thereof which are inserted into pin holes 17 in a circuit board 18. Board 18 is, in turn connected by suitable means such as displacement connectors 19 to the associated circuitry which, in FIG. 1, is represented simply by the rear member 21 of the distribution module 11 which contains such associated circuitry, such as cable connections. As was pointed out, a large amount of undesirable cross-talk is generated in the modular plugs, the wiring in the plug receptacles 13, and in the connector jacks 14. In addition, undesirable cross-talk is often induced in the cables containing the, for example, twisted pairs of wires.

Figure 3:
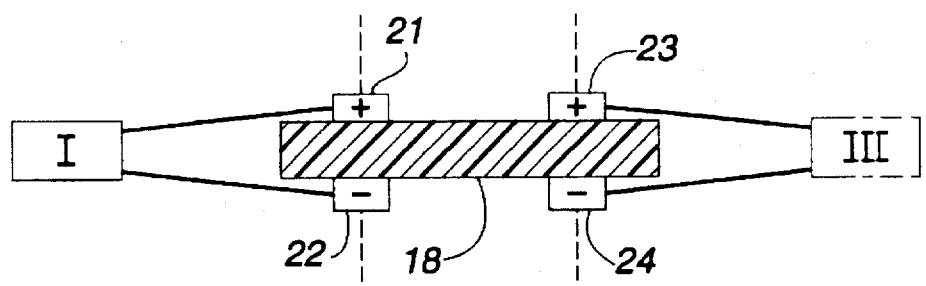
FIGS. 3, 4, and 5 are diagrammatic view of the relationship, in accordance with the invention, of the conductive traces of the several conductor pairs for one module.
Figure 4:
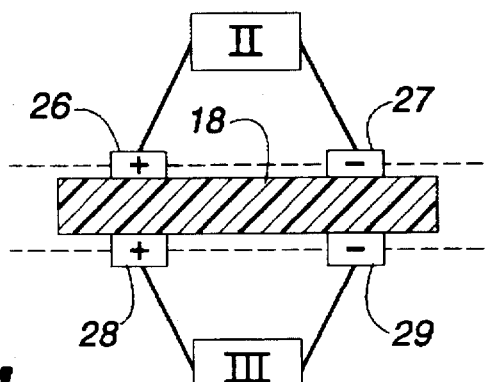
Figure 5:
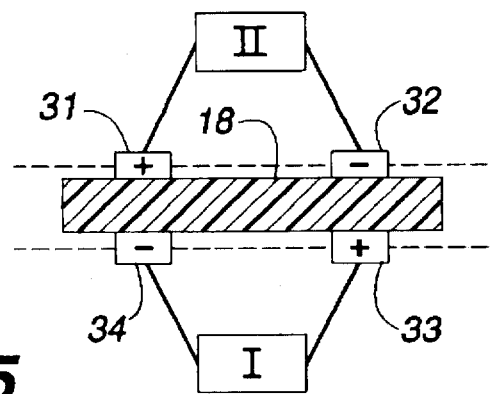

The present invention, in a first embodiment thereof discussed hereinafter, is a circuit or printed wiring board 18, of epoxy glass having FR4 dielectric material, for example, in which the undesirable cross-talk in the several pairs is canceled by inducing equal amounts of cross-talk, but opposite in sign, on the board 18. The following discussion and figures deal with one portion of the board 18 of FIG. 1, for cross-talk compensation involving one connector jack 14. It is to be understood that the board 18 actually may have as many compensating circuits thereon as there are connector jacks. In FIGS. 3, 4, and 5 there are shown diagrams of the orientation and polarity of the conductors on the board 18 for inducing canceling or compensating cross-talk. In FIG. 3 are shown the orientation and polarities for pairs I and III. In the plug and jack 14 connector, pairs I and III have the positions shown in FIG. 2, pair I, at positions 4 and 5 being straddled by pair III, at positions 3 and 6. The net result of such positioning is negative cross-talk being induced in pairs I and III. For this combination, the conductive positive path 21 lies on one surface of the board, the top surface in FIG. 3, and its negative mirror image on the bottom surface of the board 18 as the negative path 22. By making the path 22 the minor image of path 21 over at least a portion of the lengths of the paths, the impedance characteristic differences of pair I are minimized. In like manner, the top surface of the board has imprinted thereon the path 23, which is positive, for pair III in this case, and the negative mirror image path 24 is on the bottom surface of the board, with the impedance characteristics of pair III being preserved. Each pair of paths 21 and 23, and paths 22 and 24 forms a portion of an inductive loop which lies in the vertical planes designated by the dashed lines, which inductively and capacitively interact with the other inductive loop and the loops are substantially mirror images of each other. As a consequence, positive cross-talk is induced between pairs I and III, thereby effectively canceling or compensating for the negative cross-talk that existed between those pairs. In FIG. 4 there is shown the relationship between the loops or paths for pairs II and III, as printed or otherwise affixed to the opposing surfaces of board 18. In the orientation shown in FIG. 2, pairs II and III generate negative cross-talk, which can be compensated for as shown in FIG. 4. Thus, pair II has a positive path 26 and a negative path 27, both on the same surface of the board, while pair III has the same arrangement on the opposing board surface with the positive path 28 being the substantially mirror image of path 26 over at least a portion of their length and the negative path 29 being the substantially mirror image of path 27. Thus, a facing pair of loop portions as formed by paths 26 and 27 and by paths 28 and 29. The loops lie in the parallel planes indicated by the dashed lines and are substantially mirror images. With this orientation and polarity, the negative cross-talk between pairs II and III is substantially canceled. In FIG. 5 is shown the orientation and polarities for the positive and negative paths, 31 and 32 respectively, of pair II and the positive and negative paths, 33 and 34 respectively, of pair I, with the negative path 34 being the mirror image of path 31 and positive path 33 being the mirror image of path 32. Thus, a facing pair of loop portions is formed by paths 31 and 32 and by paths 33 and 34, which substantially lies in the planes indicated by the dashed lines and are substantially mirror images of each other. With this configuration, negative cross-talk is produced which effectively cancels or compensates for the positive cross-talk existing between pairs I and II.

In the foregoing description, "mirror image" for the loops or paths on opposing board surfaces means that the paths on the bottom surface, for example, have the same configuration and are directly under the corresponding path on the opposing board surface. Also, in the case of a multi-layer board, the paths may be on opposite surfaces of an intermediate layer, for example. Although perfect mirror imaging would be extremely difficult to produce, an approximation of mirror imaging has been found to produce excellent results.

Figure 7:
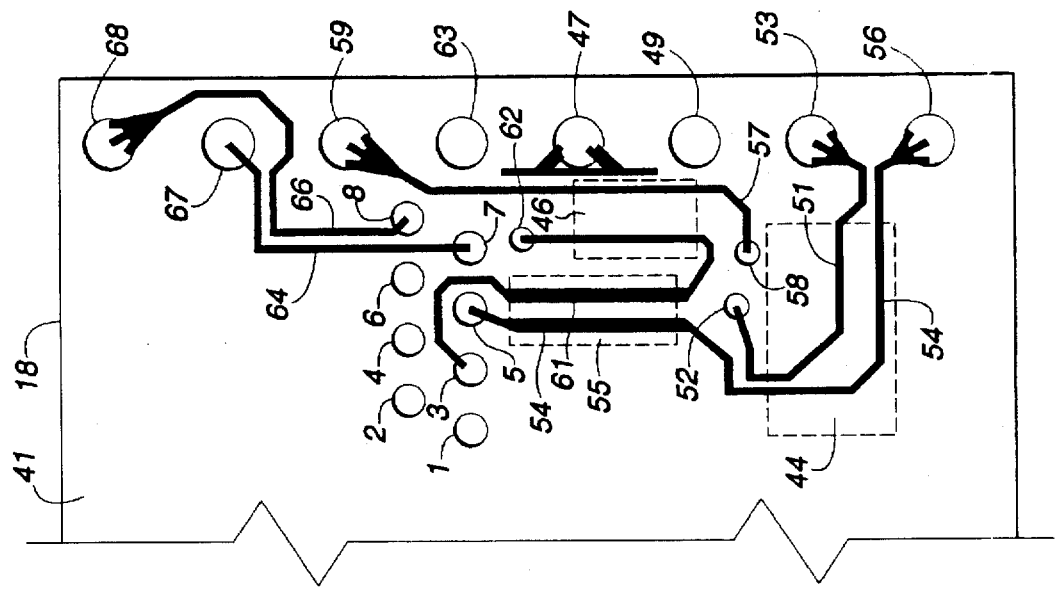
FIG. 7 is a plan view of the bottom surface of the board as viewed through the board from the top thereof, showing the conductive paths and their relationship to those on the top surface of the board.
Figure 6:
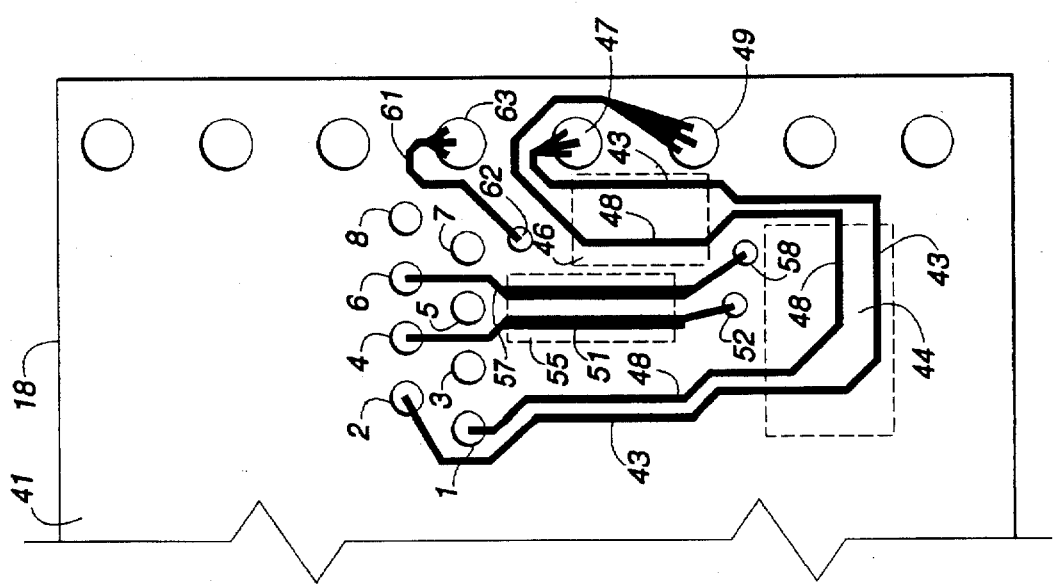
FIG. 6 is a plan view of the top surface of the board showing the conductor paths in accordance with the principles of the invention for inductive cross-talk reduction.

In FIG. 6 there is shown the surface 41, which for convenience is hereinafter designated the top surface, of the circuit board 18 of a first embodiment of the invention, and in FIG. 7 is shown the bottom surface 42 of board 18, viewed looking through the board 18 from the top surface 41 as though it were transparent. Viewed in this way, the orientation of the circuit paths relative to each other can be more easily visualized and understood. Arrayed on the board are a first group of pin receiving holes, designated, for discussion purposes and to conform to the numerical designations in FIG. 2, by the numbers 2, 4, 6, and 8, and a second group 1, 3, 5, and 7. The jack pins 16 of a connector jack 14 fit into the different holes so that, preserving the previously established convention, pin hole 2 receives the ring jack pin of pair II and pin hole 1 receives the tip jack pin of pair II. Thus, pin hole 2 is negative relative to pin hole 1, as shown in the Table of FIG. 10. In like manner, pin holes 3 and 6 receive, respectively, the tip and ring jack pins of pair III, pin holes 4 and 5 receive respectively the ring and tip pins of pair I, and pin holes 7 and 8 receive the tip and ring jack pins respectively of pair IV.

In the following description, terms such as "top", "bottom", "downward", "upward", and "side" refer to the orientation of the board as shown in FIGS. 6 and 7, and are used for ease of description only.

It can be seen in FIG. 6 that there is printed on the top surface 41 of the board a ring conductor path 43 of pair II which extends from jack pin hole 1 downward toward the bottom of the board 18 through an area 44 defined by the dashed lines, and then upward. Lead or conductor 43 passes through another area 46 as defined by the dashed lines, and then to a suitable output connection 47. The tip lead of pair II is a conductor path 48 which extends closely adjacent the parallel to lead 43 until it reaches area 44, where it is separated somewhat more from lead 43. Lead 48 then extends upward through area 46 where it is more separated from lead 43, and then extends to a suitable output connector 49 as shown, without crossing or touching lead 43.

The ring lead 51 of pair I extends from jack pin hole 4 down through a region 55 to a pass through hole 52 and then continues, on the bottom surface 42 of board 18 through the area 44 and to an output connector 53. In the region 44, lead 51 has a configuration that is directly under and the approximate mirror image of lead 48 on the top surface 41 of board 18, the tip lead 54 of pair I extends from jack pin hole 5 through region 55 where it is substantially directly beneath and the substantially mirror image of lead 51 in region 55. Leads 51 and 54 are somewhat broader within region 55, as shown, to enhance their interaction with each other. Lead 54 extends downward and passes through region 44, throughout which it is substantially directly below and substantially the mirror image of lead 43 of pair II. Lead 54 then continues to an output connection 56. Within region 44, the orientation, configuration, and polarities of the leads 43 and 48 form an inductive loop portion on the top surface 41 of board 18, which corresponds to the inductive loop portion formed by the pair II leads 31 and 32 in FIG. 5. Also, the orientation, configuration, and polarities of the leads 51 and 54 form an inductive loop portion on the bottom surface 42 of board 18, corresponding to the inductive loop portion formed by the pair I leads 33 and 34 in FIG. 5. There is thus a pair of inductive loops facing each other and separated by the thickness of the board 18 which generates negative cross-talk between pairs I and II to counteract the positive cross-talk induced therein by the connector jacks 14. At the frequencies of interest, the loops thus formed act, during operation, to induce cross-talk in their neighboring loop. The greater the separation of the paths forming a loop, the greater the inductive interaction, up to a point.

In FIG. 6 it can be seen that on the top surface 41, the ring lead 57 of pair III extends from jack pin hole 6 through region 55, where it is parallel and closely adjacent to ring lead 51 of pair I. Lead 57 extends through region 55 to a pass through hole 58 and then passes through region 46 on the bottom surface 42 of board 18 to a suitable output connection 59, as shown in FIG. 7. The tip lead 61 of pair III extends along the surface 42 through region 55, where it is parallel and closely adjacent to tip lead 54 of pair I, and is substantially a mirror image thereof, and then through region 46 where it is parallel to, but more widely separated from lead 57. Lead 61 then passes through a pass through hole 62 and then to an output 63. Thus, in region 55, the ring lead of pair I is substantially directly above, and separated from, the tip lead 54, thereby forming an inductive loop portion lying in a plane normal to board 18, in the manner of leads 21 and 22 of FIG. 3, although reversed as to polarity relative to the arrangement of FIG. 3. Also, the ring lead 57 of pair III substantially directly overlies the tip lead 61 of pair III, thereby forming an inductive loop therebetween lying in a vertical plane, as discussed relative to leads 23 and 24 of FIG. 3. There are thus two facing inductive loops that are substantially mirror images, and positive cross-talk is induced between pairs I and III to counteract the negative cross-talk exisring therebetween.

In addition to the facing inductive loops formed in regions 44 and 55, between pairs I and II and pairs I and III respectively, a third pair of facing inductive loops is formed in region 46 by ring and tip leads 43 and 48 of pair II and ring and tip leads 57 and 61 of pair III, which are substantially mirror images of each other. These two facing loops, separated by the thickness of board 18 correspond to the loops formed as shown in FIG. 4 by the leads 26 and 27 and 28 and 29, and generate positive cross-talk to compensate for the negative cross-talk exisring between pairs II and III.

Figure 9:
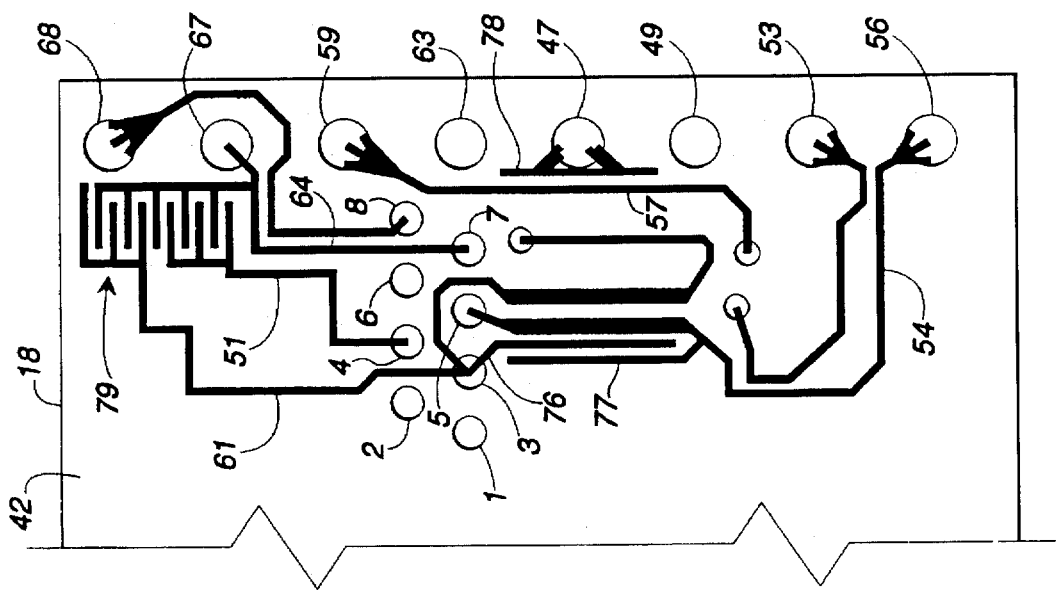
FIG. 9 is a plan view of the bottom surface of the board of FIG. 8 as viewed through the board from the top thereof.
Figure 8:
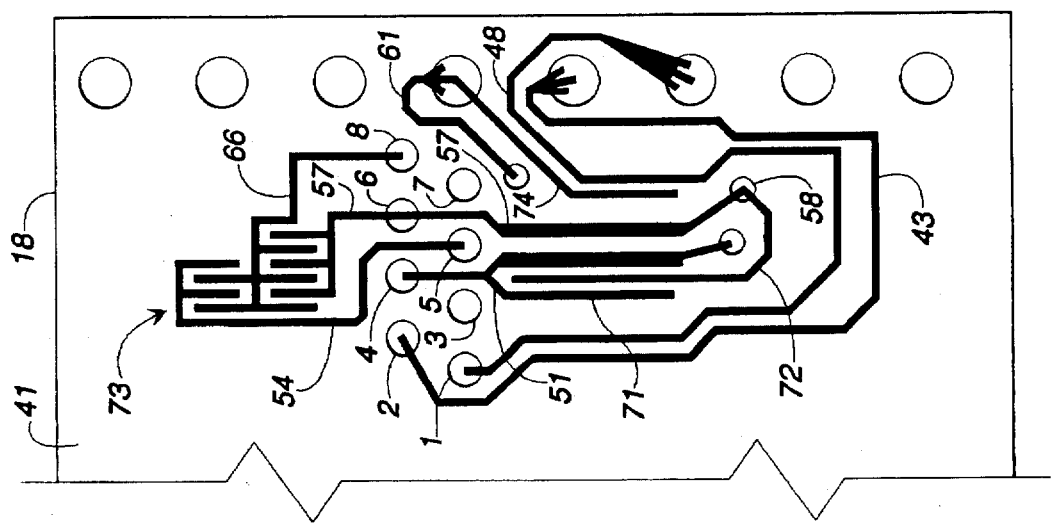
FIG. 8 is a plan view of the top surface of the board in a second embodiment of the invention.

In FIGS. 6 and 7, the leads 64 and 66 of pair IV are shown as passing directly from their respective jack pin holes 7 and 8 to outputs 67 and 68 respectively. In practice it has been found that pair IV generally does not have a large amount of cross-talk induced therein, and, as a consequence, compensation therefor is generally not necessary. Where, however, it is necessary or desirable to compensate for cross-talk in pair IV, this may be done capacitively as shown in FIGS. 8 and 9, which depict a second embodiment of the invention. Such capacitive coupling can also be used to compensate further for cross-talk among the several other pairs. In FIG. 8, ring lead 51 of pair I has a capacitance arm 71 extending parallel thereto which capacitively couples to a capacitance arm 72 extending from ring lead 57 of pair III, thereby adding capacitance compensaring cross-talk between pairs I and III. In addition, tip lead 54 of pair I, ring lead 57 of pair, and ring lead 66 of pair IV are all capacitively coupled together by means of an interdigitated capacitor 73 on the top surface 41 of board 18. Tip lead 61 of pair III also has a capacitance arm 74 extending parallel to a portion of tip lead 48 of pair II, thereby capacitively coupling them together.

On the bottom surface 42 of board 18, the tip lead 61 of pair III is capacitively coupled to tip lead 54 of pair I by means of capacitance arms 76 and 77 respectively. Ring lead 43 of pair II is capacitively coupled to ring lead 57 of pair III by means of a capacitance arm 78.

Ring lead 51 of pair I, tip lead 61 of pair III, and tip lead 64 of pair IV are all capacitively coupled to each other by means of an interdigitated capacitor 79. Thus, the arrangement of both inductively and capacitively generated cross-talk shown in FIGS. 8 and 9.

The simple inductive arrangement of FIGS. 6 and 7, and the more complex inductive-capacitance arrangement of FIGS. 8 and 9 both rely upon a circuit board map that creates a pair of inductive loops wherein the loops of a pair are facing and are substantial mirror images of each other.

For ease in tracing the various conductive paths, and for correlating the specification with the claims, reference should be made to the table of FIG. 11.

It should be noted that it will be obvious to those skilled in the art that many variations and modifications may be made to the preferred embodiment without substantial departure from the principles of the present invention or the spirit thereof. All such variations and modifications are intended to be included herein within the scope of the present invention, as set forth in the claims. Further, in the claims, the corresponding structures, materials, acts, and equivalents of all means or step-plus-function elements are intended to include any structure, material, or acts for performing the functions in combination with other claimed elements as specifically claimed.

We claim:

1. For use in a connector arrangement in a communication system, a cross-talk compensaring member comprising:

a planar substrate (18) having first and second surfaces (41,42);

connector members (1-8) on said substrate for conductively receiving the first and second leads of at least two conductor pairs;

said substrate having conductive paths thereon connecting each of the connector members to output members (47, 49, 53, 56, 59, 63, 67, 68) wherein the conductive paths (51, 54) connected to the first (4) and second (5) connector members of a first conductor pair ($R_1$, $T_1$) and the conductive paths (57, 61) connected to the first (6) and second (3) connector members of a second conductor pair ($R_3$, $T_3$) form first and second facing planar inductive loop portions, said first and second loop portions lying in planes parallel to and facing each other, said planes being normal to the plane of said substrate, and adapted to interact with each other to induce compensating cross-talk between said first and second conductor pairs.

2. A cross-talk compensating member as claimed in claim 1 wherein said first and second inductive loop portions are substantially mirror images of each other.

3. A cross-talk compensating member as claimed in claim 1 wherein the conductor members (4) for receiving the first lead of the first pair is connected to a first conductive path (51) on said first surface (41) of said substrate (18) and the connector member (5) for receiving the second lead of the first pair is connected to a second conductive path (54) on said second surface (42) of said substrate which forms a first inductive loop portion with said first conductive path; and the connector member (6) for receiving the first lead of the second pair is connected to a third conductive path (57) on said first surface (41) of said substrate and the connector member (3) for receiving the second lead of the second pair is connected to a fourth conductive path (61) on said second surface (42) of said substrate and forms a second inductive loop portion with said third path (57).

4. A cross-talk compensating member as claimed in claim 3 wherein said first and second inductive loop portions are substantially mirror images of each other.

5. A cross-talk compensating member as claimed in claim 1 and further including connector members (1, 2) on said substrate (18) for conductively receiving the first and second leads (43, 48) of a third conductor pair ($T_2$, $R_2$).

6. A cross-talk compensating member as claimed in claim 5 wherein the connector member (2) for receiving the first lead $R_2$ of said third pair is connected to a fifth conductive path (43) on said first surface (41) of said substrate (18) and the connector member (1) for receiving the second lead $T_2$ of said third pair is connected to a sixth conductive path (48) on said first surface (41) of said substrate, said fifth (43) and said sixth (48) conductive paths being spaced apart over a portion of their lengths sufficiently to form a third inductive loop portion on said first surface (41); and wherein said first (51) and second (54) conductive paths are spaced apart over a portion of their lengths sufficiently to form a fourth inductive loop portion on said second surface (42) facing said third inductive loop portion, each of said third and fourth inductive loops being substantially co-planar with said substrate (18).

7. A cross-talk compensating member as claimed in claim 6 wherein said fourth inductive loop portion on said second surface (42) is substantially coincident with said third inductive loop portion on said first surface (41) and is substantially a mirror image thereof.

8. A cross-talk compensating member as claimed in claim 5 wherein said connector member (2) for receiving the first lead ($R_2$) of the third pair ($R_2$, $T_2$) is connected to a fifth conductive path (43) on said first surface (41) of said substrate (18) and said connector member (1) for receiving the second lead ($T_2$) of the third pair is connected to a sixth conductive path (48) on said first surface (41) of said substrate (18), said fifth (43) and said sixth (48) conductive paths being spaced apart over a portion of their lengths sufficiently to form a fifth inductive loop on said first surface (41); and wherein said third (57) and fourth (61) conductive paths are spaced apart over a portion of their lengths to form a sixth inductive loop on said second surface (42) facing said fifth inductive loop portion; said fifth and sixth inductive loops being substantially co-planar with said substrate.

9. A cross-talk compensating member as claimed in claim 8 wherein said sixth inductive loop portion on said second surface (42) is substantially coincident with said fifth inductive loop portion on said first surface (41) and is substantially a mirror image thereof.

10. A cross-talk compensating member as claimed in claim 5 and further including connector members (7, 8) on said substrate (18) for conductively receiving the first $T_4$ and second $R_4$ leads of a fourth conductor pair.

11. A cross-talk compensating member as claimed in claim 10 wherein the connector member (8) for receiving the first lead of the fourth pair is connected to a seventh conductive path (66) on said first surface (41) which is terminated by a first interdigitated capacitor (73).

12. A cross-talk compensating member as claimed in claim 11 wherein said second conductive path (54) and said third conductive path (57) are terminated by said first interdigitated capacitor (73) for capacitively coupling said second, third, and seventh (54, 57, 66) conductive paths to each other.

13. A cross-talk compensating member as claimed in claim 10 wherein the connector member (7) for receiving the second lead of the fourth pair is connected to an eighth conductive path (64) on said second surface (42) which is connected to a second interdigitated capacitor (79).

14. A cross-talk compensating member as claimed in claim 13 wherein said first conductive path (51) and said fourth conductive path (61) are terminated by said second interdigitated capacitor (79) for capacitively coupling said first, fourth, and said eight (51, 61, 64) conductive paths to each other.

15. For use in a connector arrangement in a communication system, a cross-talk compensating member comprising:

a planar substrate having first and second surfaces (41, 42);

connector members (1-8) on said substrate for conductively receiving the first and second leads of at least three conductor pairs, connectors 1 and 2 receiving the third conductor pair;

said substrate having conductive paths thereon connecting each of the connector members to output members (47, 49, 53, 56, 59, 63, 67, 68) wherein the conductive paths connected to the first and second connector members of a first conductor pair and the conductive paths connected to the first and second connector members of a second conductor pair form first and second facing inductive loop portions adapted to interact with each other to induce compensating cross-talk between said first and second conductor pairs;

wherein said connector member (2) for receiving the first lead of the third pair is connected to a fifth conductive path (43) on said first surface (41) of said substrate (18) and the connector member (1) for receiving the second lead of the third pair is connected to a sixth conductive path (48) on said first surface (41) of said substrate (18), said fifth (43) and said sixth (48) conductive paths being spaced apart over a portion of their lengths sufficiently to form a fifth inductive loop portion on said first surface (41); and wherein said third (57) and fourth (61) conductive paths are spaced apart over a portion of their lengths sufficient to form a sixth inductive loop on said second surface (42) facing said fifth inductive loop portion.

16. A cross-talk compensating member as claimed in claim 15 wherein said sixth inductive loop portion on said second surface (42) is substantially coincident with said fifth inductive loop portion on said first surface (41) and is substantially a mirror image thereof.

* * * * *